United States Patent [19]
Kawakami et al.

[11] Patent Number: 5,760,632
[45] Date of Patent: Jun. 2, 1998

[54] DOUBLE-BALANCED MIXER CIRCUIT

[75] Inventors: Masayuki Kawakami; Yoshiyasu Tsuruoka, both of Sapporo, Japan

[73] Assignee: Fujitsu Limited, Kanagawa, Japan

[21] Appl. No.: 641,237

[22] Filed: Apr. 30, 1996

[30] Foreign Application Priority Data

Oct. 25, 1995 [JP] Japan ................... 7-278180

[51] Int. Cl.$^6$ ........................ G06G 7/12
[52] U.S. Cl. ........................ 327/355; 327/113
[58] Field of Search ................ 327/355, 356, 327/359, 361, 113, 52, 55, 63, 90; 455/189.1, 293, 326, 209, 333, 323, 319, 284

[56] References Cited

U.S. PATENT DOCUMENTS

| | | | |
|---|---|---|---|
| 4,480,337 | 10/1984 | Graziadei et al. | 455/333 |
| 4,636,663 | 1/1987 | Jongepier et al. | 327/113 |
| 4,776,040 | 10/1988 | Ichikawa et al. | 455/315 |
| 4,912,520 | 3/1990 | Yamamoto et al. | 455/333 |
| 4,937,516 | 6/1990 | Sempel | 323/315 |
| 5,339,458 | 8/1994 | Nakatsuka et al. | 455/333 |
| 5,379,457 | 1/1995 | Nguyen | 455/323 |
| 5,521,545 | 5/1996 | Terry et al. | 327/359 |

FOREIGN PATENT DOCUMENTS 62-79674  4/1987  Japan.

*Primary Examiner*—Timothy P. Callahan
*Assistant Examiner*—My-Trang Nu Ton
*Attorney, Agent, or Firm*—Helfgott & Karas, P.C.

[57] ABSTRACT

The present invention relates to a double-balanced mixer circuit. The double-balanced mixer circuit consists of a first differential circuit formed of a first transistor and a second transistor connected differentially to each other for receiving a first input signal; and a second differential circuit formed of a third transistor and a fourth transistor connected differentially to each other for receiving a second input signal; either the junction of the drain or collector of the first transistor and the drain or collector of the third transistor or the junction of the drain or collector of the second transistor and the drain or collector of the fourth transistor producing an output signal having frequency information on the sum of the first input signal and the second input signal or the difference between them. The double-balanced mixer circuit is used suitably as a frequency converter which is used at the high-frequency section in a mobile communications equipment such as portable telephones. The object is to handle sufficiently with a reduced voltage of the power source and to facilitate the input operation.

21 Claims, 6 Drawing Sheets

1

DOUBLE-BALANCED MIXER CIRCUIT

BACKGROUND OF THE INVENTION

1) Field of the Invention

The present invention relates to a double-balanced mixer circuit used suitably as a frequency converter which is used at the high-frequency section in mobile communications equipment such as portable telephones.

2) Description of the Related Art

FIG. 6 is a block diagram showing a transmitter and receiver section of a portable telephone. As shown in FIG. 6, the portable telephone includes an antenna 101, a transmit/receive multiplexer 102, a transmitting system 103, and a receiving system 104. The transmitting system 103 includes a modulator 105, an up-converter 106 acting as a frequency converter, an amplifier 107, and the like. The receiving system 104 includes a low-noise amplifier 108, a down-converter 109 acting as a frequency converter, a demodulator 110, and the like.

The up-converter 106 is formed of a mixer circuit 106A and a local oscillator 106B. The down-converter 109 is formed of a mixer circuit 109A and a local oscillator 109B.

In the transmission of such a configuration, when the modulator 105 modulates a transmission signal into an IF signal (intermediate frequency signal), the up-converter 106 frequency-converts the IF signal into a RF signal (radio frequency signal) using an LO signal (local signal; a local oscillator output). Then the amplifier 107 amplifies further the RF signal. The resultant signal is transmitted in the form of radio waves from the antenna 101 via the transmit/receive multiplexer 102. In the receiving operation, the low-noise amplifier 108 amplifies the signal received by the antenna 101 via the transmit/receive multiplexer 102. The down-converter 109 frequency-converts the RF signal from the low-noise amplifier 108 into an IF signal using the LO signal. Then the demodulator 110 demodulates the IF signal.

By the way, in the portable telephones, each of the mixer circuit 106A of the up-converter 106 and the mixer circuit 109A of the down-converter 109 employs a double-balanced mixer circuit.

At present days, the double-balanced mixer circuit used in mobile telecommunications employs the gilbert cell structure formed of silicon bipolar transistors.

The gilbert cell, as shown in FIG. 5, includes two transistors Q51 and Q52 connected differentially to each other, two transistors Q53 and Q54 connected differentially to each other, and two transistors Q55 and Q56 connected differentially to each other. The emitters of the transistors Q51 and Q52 are connected to each other and the emitters of the transistors Q53 and Q54 are connected to each other. The junction where the emitters of the transistors Q51 and Q52 are connected is connected to the collector of the transistor Q55. The junction where the emitters of the transistors Q53 and Q54 are connected is connected to the collector of the transistor Q56. The emitter of the transistor Q55 is grounded via the resistor R51. The emitter of the transistor Q56 is grounded via the resistor R52. The emitter of the transistor Q55 is connected to the emitter of the transistor Q56 via the register R53. In such a configuration, the transistors are cascaded in two stage form and the emitters are respectively grounded via the resistors.

The bases of the transistors Q52 and Q53 are grounded via the capacitor C51 and the base of the transistor Q56 is grounded via the capacitor C52.

The power source voltage Vcc is applied to the collectors of the transistors Q51 and Q53 via the inductance L51 and to the collectors of the transistors Q52 and Q54 via the inductance L52. The power source voltage Vb2 is applied to the base of the transistor Q51 via the resistor R55, to the bases of the transistors Q52 and Q53 via the resistor R56, and to the base of the transistor Q54 via the resistor R57. The power source voltage Vb1 is applied to the base of the transistor Q55 via the resistor R58 and to the base of the transistor Q56 via the resistor R59.

In such a configuration, when the LO signal (local signal) is input to the bases of the upper stage transistors Q51 and Q54 and the RF signal (radio frequency signal) or IF signal (intermediate frequency signal) is input to the base of the lower stage transistor Q55 via the capacitor C53, the IF signal or RF signal is output from the collectors of the upper stage transistors Q52 and Q54 via the capacitor C54. As a result, the double-balanced mixer circuit can make full use of the function of the down-converter or up-converter. With the RF signal and LO signal input, and IF signal output, the mixer circuit functions as a down-converter. With the IF signal and the LO signal input and the RF signal output, the mixer circuit functions as a up-converter.

In response to recent strong demands for small portable telephone sets, reexamination is being made from various angles. For example, the device can be miniaturized by reducing the number of batteries mounted. It may be considered to reduce the power source voltage from 5 volts to 3 volts. The power source voltage used in the portable telephone before several years was 5 volts, but the power source voltage currently used is 3 volts. It is predicted that a demand for further voltage reduction will be increased from now on.

However, the gilbert cell acting as the general double-balanced mixer circuit has the tandem transistor circuit configuration in two stage, described above. Hence, there is a problem in that the use of the voltage source of 3 volts or less makes it difficult to operate the circuit because of the insufficient VCE per transistor.

Japanese Patent Laid-open publication (Tokkai-sho) No. 62-79674 discloses in FIG. 1 the circuit configuration in which two differential circuits are arranged in parallel, instead of transistors cascaded in two stage form. However, this circuit configuration has the following problem. That is, the circuit in which a signal is input directly from the source of a transistor requires inputting the signal via a certain circuit for isolation in practical use. Moreover, the circuit requires a large input power because the two wave splitting input system is adopted. Hence, there is the problem in that the inputting operation is difficult.

SUMMARY OF THE INVENTION

The present invention is made to overcome the above mentioned problems. An object of the present invention is to provide a double-balanced mixer circuit that can handle sufficiently with a lower voltage of a power source and facilitates the input operation.

In order to achieve the above objects, according to the present invention, the double-balanced mixer circuit is characterized by a first differential circuit formed of a first transistor and a second transistor connected differentially to each other; a second differential circuit formed of a third transistor and a fourth transistor connected differentially to each other; the first transistor having a source or emitter connected to a source or emitter of the second transistor; the third transistor having a source or emitter connected to a source or emitter of the fourth transistor; the first transistor having a drain or collector connected to a drain or collector of the third transistor; the second transistor having a drain or collector connected to a drain or collector of the fourth transistor; and a leak cancelling capacitor connecting the junction of the drain or collector of the first transistor and the drain or collector of the third transistor with the junction of the drain or collector of the second transistor and the drain or collector of the fourth transistor; either the junction of the drain or collector of the first transistor and the drain or collector of the third transistor or the junction of the drain or collector of the fourth transistor and the drain or collector of the second transistor producing an output signal having frequency information on the sum of a first input signal and a second input signal or the difference between them when the first input signal is input to the first differential circuit and the second input signal is input to the second differential circuit.

The double-balanced mixer circuit is characterized in that each of the first transistor, second transistor, third transistor, and fourth transistor has a gate or base grounded via a resistor or inductance.

Moreover, the double-balanced mixer circuit is characterized in that each of the first transistor, second transistor, third transistor, and fourth transistor has a gate or base connected to a power source via a resistor or inductance.

The double-balanced mixer circuit is characterized in that the junction of the source or emitter of the first transistor and the source or emitter of the second transistor is grounded via a resistor, and that the junction of the source or emitter of the third transistor and the source or emitter of the fourth transistor is grounded via a resistor.

Furthermore, the double-balanced mixer circuit is characterized in that the junction of the drain or collector of the first transistor and the drain or collector of the third transistor is connected to a power source via an inductance or resistor, and that the junction of the drain or collector of the second transistor and the drain or collector of the fourth transistor is connected to a power source via an inductance or resistor.

The double-balanced mixer circuit is characterized in that the power source which supplies a voltage to the junction of the drain or collector of the first transistor and the drain or collector of the third transistor is shared with the power source which supplies a voltage to the junction of the drain or collector of the second transistor and the drain or collector of the fourth transistor.

Moreover, the double-balanced mixer circuit is characterized in that the gate or base of one of the first and second transistors is grounded via a capacitor exhibiting a low impedance at the frequency of a first input signal when the first input signal is input to the gate or base of the other one of the first and second transistors in the first differential circuit; and that the gate or base of one of the third and fourth transistors is grounded via a capacitor exhibiting a low impedance at the frequency of a second input signal when the second input signal is input to the gate or base of the other one of the third and fourth transistors in the second differential circuit.

The double-balanced mixer circuit is characterized in that a first inverted input signal obtained by inverting a first input signal is input to the gate or base of one of the first and second transistors when the first input signal is input to the gate or base of the other one of the first and second transistors in the first differential circuit; and that a second inverted input signal obtained by inverting a second input signal is input to the gate or base of one of the third and fourth transistors when the second input signal is input to the gate or base of the other one of the third and fourth transistors in the second differential circuit.

Moreover, the double-balanced mixer circuit is characterized in that the gate or base of one of the first and second transistors and the gate or base of the other one of the first and second transistors are grounded via a first phase inverting circuit; and that the gate or base of one of the third and fourth transistors and the gate or base of the other one of the third and fourth transistors are grounded via a second phase inverting circuit.

The double-balanced mixer circuit is characterized in that the leak cancelling capacitor is formed of a capacitor exhibiting a low impedance at the frequency of any one of the first input signal, the second input signal, and the output signal.

As described above, in the double-balanced mixer circuit according to the present invention, an output signal having frequency information on the sum of a first input signal and a second input signal or the difference between them is output from either the junction of the drain or collector of the first transistor and the drain or collector of the third transistor or the junction of the drain or collector of the second transistor and the drain or collector of the fourth transistor when the first input signal is input to the first differential circuit which is formed of a first transistor and a second transistor differentially connected to each other and the second input signal is input to the second differential circuit which is formed of a third transistor and a fourth transistor differentially connected to each other. Hence, the double-balanced mixer circuit has the advantage of facilitating the input operation with a sufficient countermeasure against a reduced voltage of the power source.

Moreover, a single power source self-bias circuit can be configured by using in common the power source which supplies a voltage to the junction where the drain or collector of the first transistor is connected to the drain or collector of the third transistor and the power source which supplies a voltage to the junction where the drain or collector of the second transistor is connected to the drain or collector of the fourth transistor, or by grounding the gates or bases of the first transistor, second transistor, third transistor, and fourth transistor via a resistor or inductance. Hence, a simplified double-balanced mixer circuit can be formed.

Furthermore, a dual power source circuit can be formed as a drain or collector bias source and a gate or base bias source by connecting respectively the gates or bases of the first transistor, second transistor, third transistor, and fourth transistor to a power source via a resistor or inductance. This configuration can turn on or off the power source for the gate or base of a transistor to control the consumption current of the whole circuit, thus contributing advantageously to the power saving.

Moreover, the double-balanced mixer circuit can be formed in such a manner that a first inverted input signal obtained by inverting a first input signal is input to the gate or base of one of the first and second transistors when the first input signal is input to the gate or base of the other one of the first and second transistors in the first differential circuit; and that a second inverted input signal obtained by inverting a second input signal is input to the gate or base of one of the third and fourth transistors when the second input signal is input to the gate or base of the other one of the third and fourth transistors in the second differential circuit. This configuration allows the input signal with the phase clearly inverted to be used, whereby the leak canceling amount can be set to a larger value.

DESCRIPTION OF THE PREFERRED EMBODIMENTS

(a) First Embodiment

Next, embodiments according to the present invention will be explained below by referring to the attached drawings.

Figure 1:
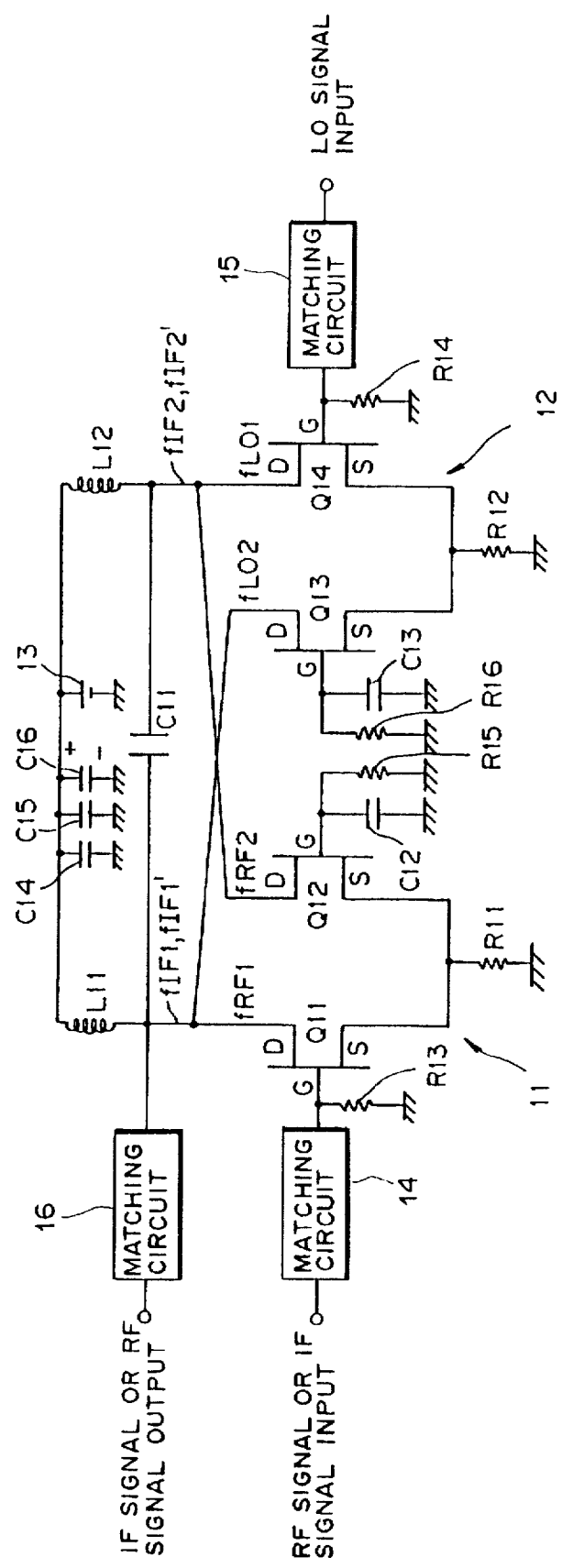
FIG. 1 is an electrical circuit diagram showing a double-balanced mixer circuit according to the first embodiment of the present invention.

The double-balanced mixer circuit according to the present embodiment is used as a mixer circuit for the up-converter or the down-converter in the before-described portable telephone set. FIG. 1 is an electrical circuit diagram showing the first embodiment according to the present invention.

As shown in FIG. 1, the double-balanced mixer circuit according to the first embodiment includes a first differential circuit 11 formed of a depletion mode field-effect transistor (hereinafter, referred to as a D-mode FET) Q11 acting as a first transistor and a D-mode FET Q12 acting as a second transistor which are connected differentially to each other and a second differential circuit 12 formed of a D-mode FET (third transistor) Q13 and a D-mode FET (fourth transistor) Q14 which are connected differentially to each other.

The source of the D-mode FET Q11 is connected to the source of the D-mode FET Q12 and grounded via the resistor R11. The source of the D-mode FET Q13 is connected to the source of the D-mode FET Q14 and grounded via the resistor R12. That is, the junction where the sources of the D-mode FETs Q11 and Q12 are connected to each other is grounded via the resistor R11 and the junction where the sources of the D-mode FETs Q13 and Q14 are connected to each other is grounded via the leak cancelling resistor R12.

The drains of the D-mode FETs Q11 and Q13 are connected to each other and the drains of the D-mode FETs Q12 and Q14 are connected to each other. The junction where the drains of the D-mode FETs Q11 and Q13 are connected to each other is connected to the junction where the drains of the D-mode FETs Q12 and Q14 are connected to each other via the leak cancelling capacitor C11.

Moreover, the gate of the D-mode FET Q11 is grounded via the resistor R13 (or inductance) and the gate of the D-mode FET Q14 is grounded via the resistor R14 (or inductance). The gate of the D-mode FET Q12 is grounded via the resistor R15 (or inductance) and the capacitor C12 and the gate of the D-mode FET Q13 is grounded via the resistor R16 (or inductance) and the capacitor C13.

The junction where the drains of the D-mode FETs Q11 and Q13 are connected to each other is connected to the power source 13 via the inductance (or resistor) L11. The junction where the drains of the D-mode FETs Q12 and Q14 are connected to each other is connected to the power source 13 via the inductance (or resistor) L12. Thus, the power source supplies in common a voltage to the junction where the drains of the D-mode FETs Q11 and Q13 are connected to each other and the junction where the drains of the D-mode FETs Q12 and Q14 are connected to each other.

The RF signal or IF signal acting as the first input signal is input to the gate of the D-mode FET Q11 forming the first differential circuit 11 via the matching circuit 14. The LO signal acting as the second input signal is input to the gate of the D-mode FET Q14 forming the second differential circuit 12 via the matching circuit 15. The output signal (IF signal or RF signal) with frequency information regarding the sum of the RF or IF signal and the LO signal, or the difference between them is output from the junction where the drains of the D-mode FETs Q11 and Q13 are connected or the junction where the drains of the D-mode FETs Q12 and Q14 are connected, as will be described later, via the matching circuit 16 according to the theory to be described later. The matching circuits 14 to 16 correspond to impedance matching circuits.

The capacitor C12 is a capacitor having a low impedance at the frequency of the RF or IF signal. The capacitor C13 is a capacitor having a low impedance at the frequency of the LO signal. The gate of the D-mode FET Q12 is grounded via the capacitor C12, with high-frequency components. The gate of the D-mode FET Q13 is grounded via the capacitor C13, with high-frequency components.

The leak cancelling capacitor C11 is a capacitor exhibiting a low impedance at the frequency of any one of the RF signal, the IF signal, and the LO signal, that is, the first input signal, the second input signal and the output signal aforementioned.

In proximity to the power source 13, the capacitors C14 and C15 and the eletrolytic capacitor C16 for cutting noises are connected in parallel to the power source 13 and ground with high-frequency components.

In the above-mentioned configuration of the circuit shown in FIG. 1, when the RF or IF signal is input to the gate of the D-mode FET Q11 via the matching circuit 14, the signal fRF1 is output from the drain of the D-mode FET Q11 while the signal fRF2 of opposite phase to that of the signal fRF1 is output from the drain of the D-mode FET Q12.

Similarly, the output signal fLO1 of the D-mode FET Q14 and the output signal fLO2 of the D-mode FET Q13 are in an opposite state in phase to each other.

By subjecting the signal fRF1 output from the D-mode FET Q11 and the signal fLO2 output from the D-mode FET Q13 to a frequency conversion, the signal fIF1 including the sum component of the frequencies of two signals and the signal fIF1' including the difference component between the frequencies of two signals are output from the junction where the drains of the D-mode FETs Q11 and Q13 are connected to each other.

Similarly, by carrying out the frequency conversion, the signal fIF2 including the sum component of the frequencies of two signals and the signal fIF2' including the difference component between them are output from the junction where the drains of the D-mode FETs Q12 and Q14 are connected to each other.

The capacitor C11 connects the junction where the drains of the D-mode FETs Q11 and Q13 are connected to each other with the junction where the drains of the D-mode FETs Q12 and Q14 are connected to each other. The capacitor C11 synthesizes the frequency-converted signals fIF1, fIF1', and fIF2, fIF2', the output signal fRF1 from the D-mode FET Q11, the output signal fLO2 from the D-mode FET Q13, the output signal fRF2 from the D-mode FET Q12, and the output signal fLO1 from the D-mode FET Q14.

The signals fIF1 and fIF2 have the same phase while the signals fIF1' and fIF2' have the same phases. In the synthesizing operation, the amplitude is increased by 3 dB. Since the phase of the signal fRF1 is inverted to that of the signal fRF2 and the phase of the signal fLO1 is inverted to that of the signal fLO2, the amplitudes are canceled. As a result, only frequency-converted component appears at the output terminal.

In the circuit shown in FIG. 1, for example, it will be explained below that the IF signal can be output in response to the RF signal and the LO signal, using the following numerical expressions.

$$RF \cdot \overline{LO} = e_0 \sin \omega_s t \cdot (-e_1 \sin \omega_o t)$$
$$= -e_0 e_1 \cdot 1/2[\sin(\omega_s + \omega_o)t - \sin(\omega_s - \omega_o)t)]$$
$$\overline{RF} \cdot LO = -e_0 \sin \omega_s t \cdot (e_1 \sin \omega_o t)$$
$$= -e_0 e_1 \cdot 1/2[\sin(\omega_s + \omega_o)t - \sin(\omega_s - \omega_o)t]$$

where $RF=e_0 \sin \omega_s t$ in the RF signal, $\overline{RF}=-e_0 \sin \omega_s t$ in the inverted signal of a RF signal, $LO=e_1 \sin \omega_o t$ in the LO signal, and $\overline{LO}=-e_1 \sin \omega_o t$ in the inverted signal of an LO signal.

The leak components of the signals RF, $\overline{RF}$, LO, and $\overline{LO}$ are synthesized with the signals RF, $\overline{LO}$, $\overline{RF}$, and LO at the output port.

That is, $RF+\overline{RF}+LO+\overline{LO}+RF\cdot\overline{LO}+\overline{RF}\cdot LO=-e_0 e_1[\sin (\omega_s+\omega_o)t-\sin (\omega_s-\omega_o)t]$ As a result, it is understood that the output signal (IF or RF signal) which has frequency information including the sum of the RF or IF signal and the LO signal or the difference between the RF or IF signal and the LO signal is output.

When the IF signal is output in response to the RF signal and the LO signal, the mixer circuit functions as a down-converter. When the Rf signal is output in response to the IF signal and the LO signal, the mixer circuit functions as an up-converter.

Thus, the double-balanced mixer circuit which facilitates the inputting operation and deals sufficiently with the power source voltage (3 volts) decreased can be provided.

Using the D-mode FETs allows the double-balanced mixer circuit to be simply configured in a self bias circuit with a single power source.

(b) Second Embodiment

The double-balanced mixer circuit according to the second embodiment can be used as the mixer circuit for the up-converter or down-converter for the portable telephone. However, in the double-balanced mixer circuit according to the second embodiment, the D-mode FET or enhancement-mode field-effect transistors (hereinafter, the enhancement-mode field-effect transistor is referred to as an E-mode FET but referred to merely as a FET when the D-mode FET is not distinguished from the E-mode FET) are used as the transistors. Moreover, a dual power source circuit is formed by using the power source 27 supplied to the gates of FETs, together with the power source 23 for the drains of FETs.

That is, the common power source 23 is connected to the drains of the FETs Q21 and Q23 via the inductance L21 and to the drains of the FETs Q22 and Q24 via the inductance L22. The common power source 27 is connected to the gate of the FET Q21 via the resistor R23, to the gate of the FET Q22 via the resistor R25, to the gate of the FET Q23 via the resistor R26, and to the gate of the FET Q24 via the resistor R24.

The elements constituting the instant circuit corresponds to those in the first embodiment. That is, the differential circuit 21 is identical structurally and functionally to the differential circuit 11 and the differential circuit 22 is identical structurally and functionally to the differential circuit 12. The matching circuits 24 to 26 have the same structures and functions as those of the matching circuits 14 to 16, respectively. The resistors R21 to R26 have the same functions as those of the resistors R11 to R16, respectively. The capacitors C21 to C26 have the same functions as those of the capacitors C11 to C16, respectively. The inductances L21 and L22 have the same functions as those of the inductances L11 and L12, respectively.

Figure 2:
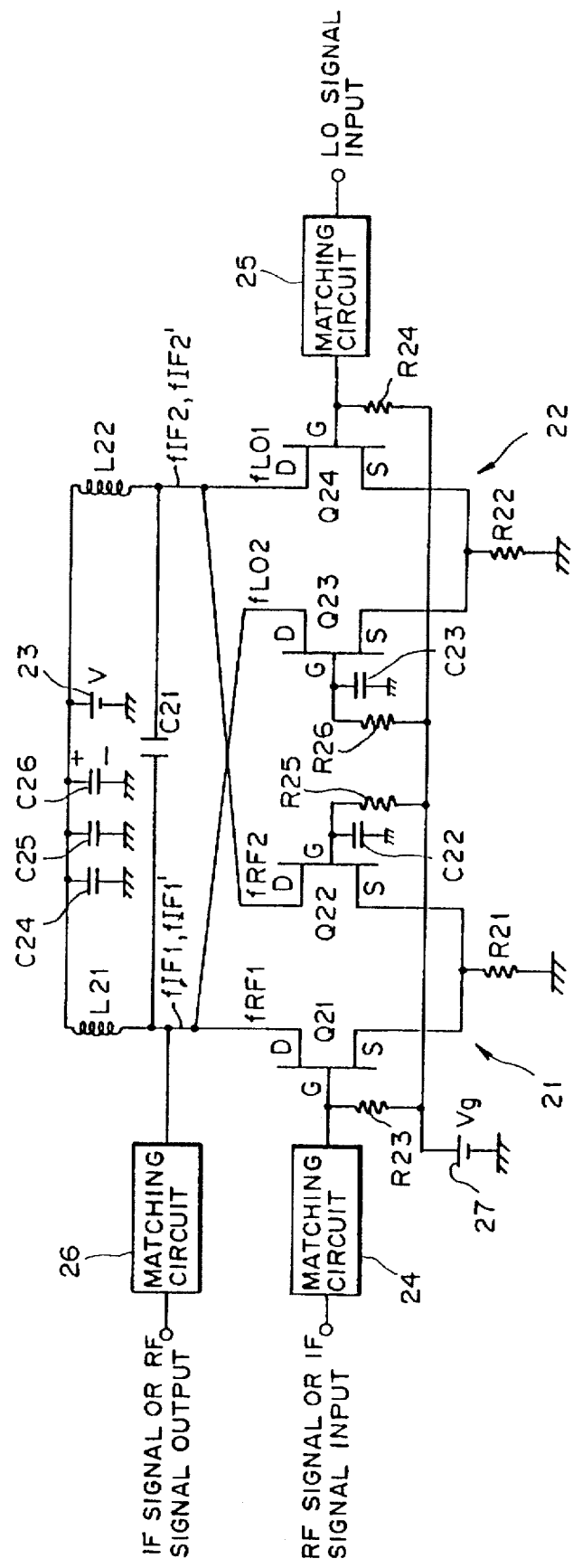
FIG. 2 is an electrical circuit diagram showing a double-balanced mixer circuit according to the second embodiment of the present invention.

In the circuit configuration shown in FIG. 2, when the RF or IF signal is input to the gate of the FET Q21 via the matching circuit 24 and the LO signal is input to the gate of FET Q24 via the matching circuit 25, the IF or RF signal being a frequency-converted signal is output at the output terminal according to the theory and operation similar to those in the circuit shown in the first embodiment.

In this case, when the RF signal and the LO signal are input and the IF signal is output, the mixer circuit functions as a down-converter. When the IF signal and the LO signal are input and the RF signal is output, the mixer circuit functions as an up-converter.

As described above, in the second embodiment, the double-balanced mixer circuit which can deal sufficiently with the power source voltage (3 volts) decreased and facilitates the inputting operation can be provided.

The double-balanced mixer circuit according to the second embodiment employs a dual power source circuit configuration. Hence, the consumed current of the whole circuit can be controlled by turning on/off the power source 27, thus contributing to the power saving.

(c) Third Embodiment

The double-balanced mixer circuit according to the third embodiment is used as a mixer circuit for the up-converter or down-converter in the potable telephone. In the double-balanced mixer circuit according to the third embodiment, bipolar transistors are used as transistors. Like the second embodiment, the dual power source circuit configuration is formed by using the power source 37 for the bases of the bipolar transistors Q31 to Q34, in addition to the power source 33 for the collectors of the bipolar transistors Q31 to Q34.

The elements forming the instant circuit correspond to those in the first and second embodiments. That is, the differential circuit 31 corresponds structurally and functionally to the differential circuits 11 and 21. The differential circuit 32 corresponds structurally and functionally to the differential circuits 12 and 22. The matching circuits 34 to 36 correspond structurally and functionally to the matching circuits 14 to 16 and 24 to 26. The resistors R31 to R36 correspond functionally to the resistors R11 to R16 and R21 to R26. The capacitors C31 to C36 correspond functionally to the capacitors C11 to C16 and C21 to C26. The inductance L31 corresponds to the inductances L11 and L21. The inductance L32 corresponds to the inductances L12 and L22.

Figure 3:
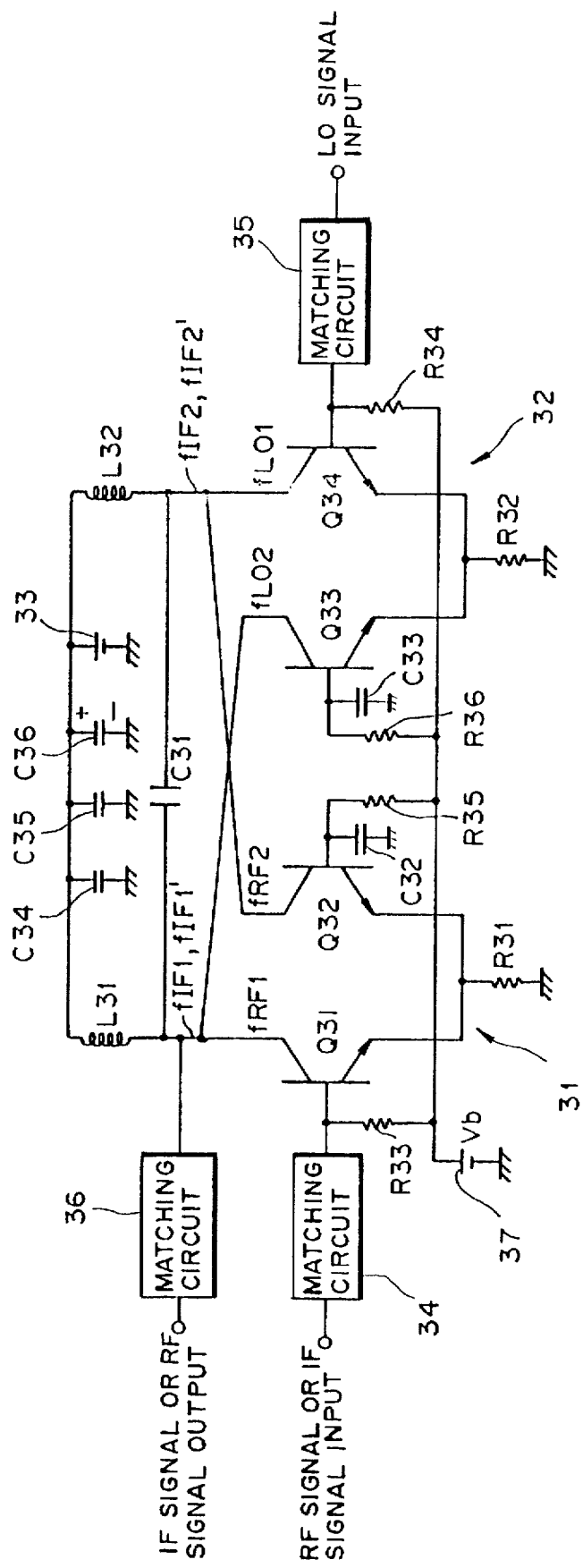
FIG. 3 is an electrical circuit diagram showing a double-balanced mixer circuit according to the third embodiment of the present invention.

In the circuit configuration shown in FIG. 3, when the RF or IF signal is input to the gate of the bipolar transistor Q31 via the matching circuit 34 and the LO signal is input to the gate of the bipolar transistor Q34 via the matching circuit 35, the IF or RF signal being a frequency-converted signal is output at the output terminal according to the same theory and operation as those in the first and second embodiments.

In this case, when the RF signal and the LO signal are input and the IF signal is output, the mixer circuit functions as a down-converter. When the IF signal and the LO signal are input and the RF signal is output, the mixer circuit functions as an up-converter.

As described above, according to the third embodiment, the double-balanced mixer circuit which facilitates the inputting operation and can be sufficiently operated with the reduced power source voltage (3 volts) can be provided. In addition, the double-balanced mixer circuit has a dual power source circuit configuration similar to that in the second embodiment. Therefore, there is the advantage in that the double-balanced mixer circuit can control the consumed current in the whole circuit by turning on or off the power source 37, thus contributing to the power saving.

(d) Fourth Embodiment

The double-balanced mixer circuit according to the fourth embodiment is used as a mixer circuit for the up-converter or down-converter in the potable telephone. However, in the double-balanced mixer circuit according to the fourth embodiment, the RF signal or the IF signal (first input signal) is input to the gate of the D-mode FET Q41 in the first differential circuit 41 while the LO signal (second input signal) is input to the gate of the D-mode FET Q44 in the second differential circuit 42. Moreover, the inverted signal of the RF or IF signal is input to the gate of the D-mode FET Q42 while the inverted signal of the LO signal is input to the gate of the D-mode FET Q43.

In the fourth embodiment, the gate of the D-mode FET Q41 is connected to the gate of the D-mode FET Q42 via the matching circuit 44, the phase shifter 47 acting as the first phase inverting circuit and the matching circuit 44' (having the same function and configuration as the matching circuit 44). The gate of the D-mode FET Q44 is connected to the gate of the D-mode FET Q43 via the matching circuit 45, the phase shifter 48 acting as the second phase inverting circuit and the matching circuit 45' (having the same function and configuration as the matching circuit 45). The phase shifter 47 adjusts the signal phase and outputs the signal obtained by inverting the RF or IF signal. The phase shifter 48 adjusts the signal phase and outputs the signal obtained by inverting the LO signal.

The constituent elements in the present circuit are the same as those in the first embodiment, except that signals which are out of phase with each other are input respectively to the confront transistors. That is, the differential circuit 41 corresponds structurally and functionally to the differential circuit 11 while the differential circuit 42 corresponds structurally and functionally to the differential circuit 12. The matching circuits 44 to 46 correspond structurally and functionally to the matching circuits 14 to 16. The resistors R41 to R46 correspond functionally to the resistors R11 to R16. The capacitors C44 to C46 correspond functionally to the capacitors C14 to C16. The inductances L41 to L42 correspond functionally to the inductances L11 to L12.

Figure 4:
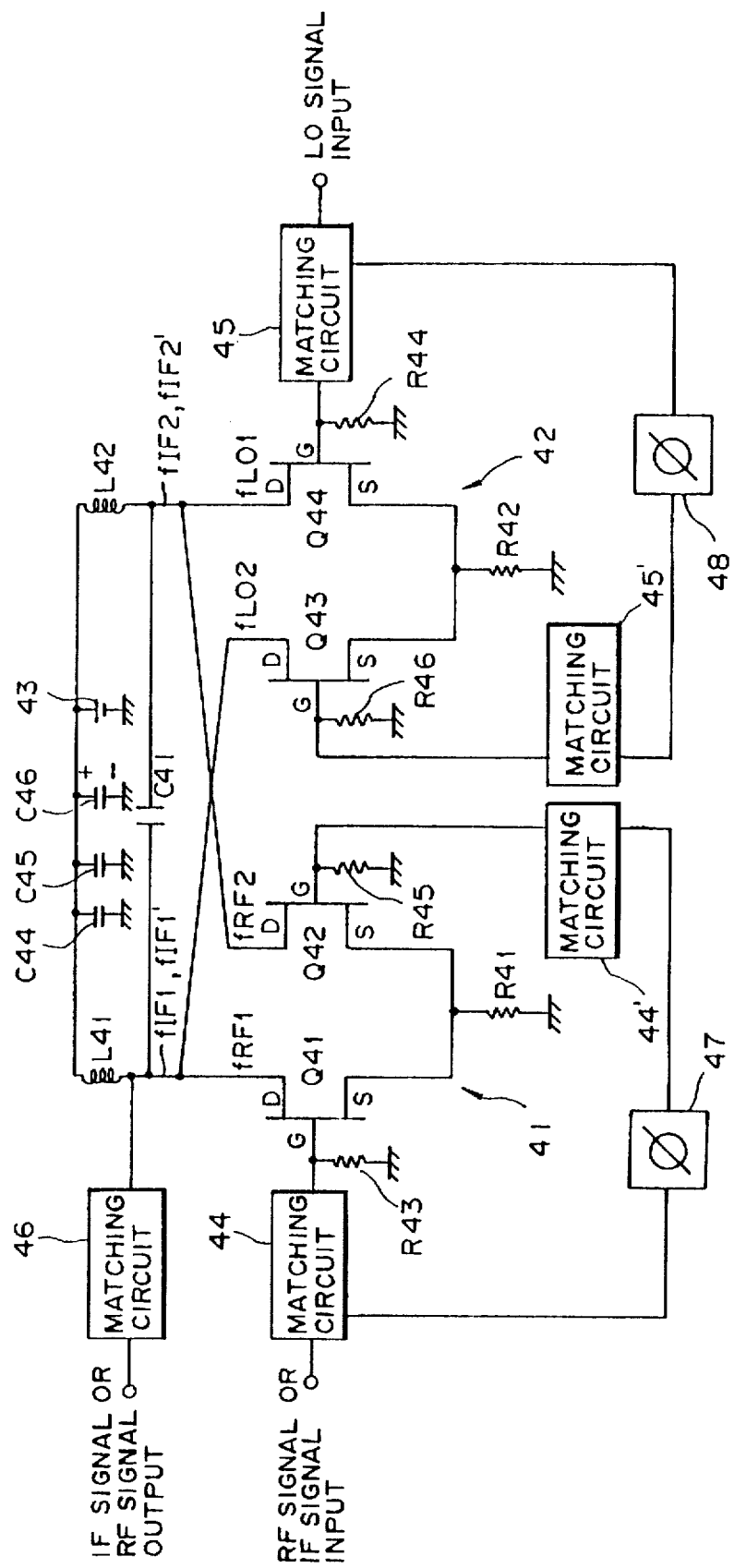
FIG. 4 is an electrical circuit diagram showing a double-balanced mixer circuit according to the fourth embodiment of the present invention.
Figure 5:
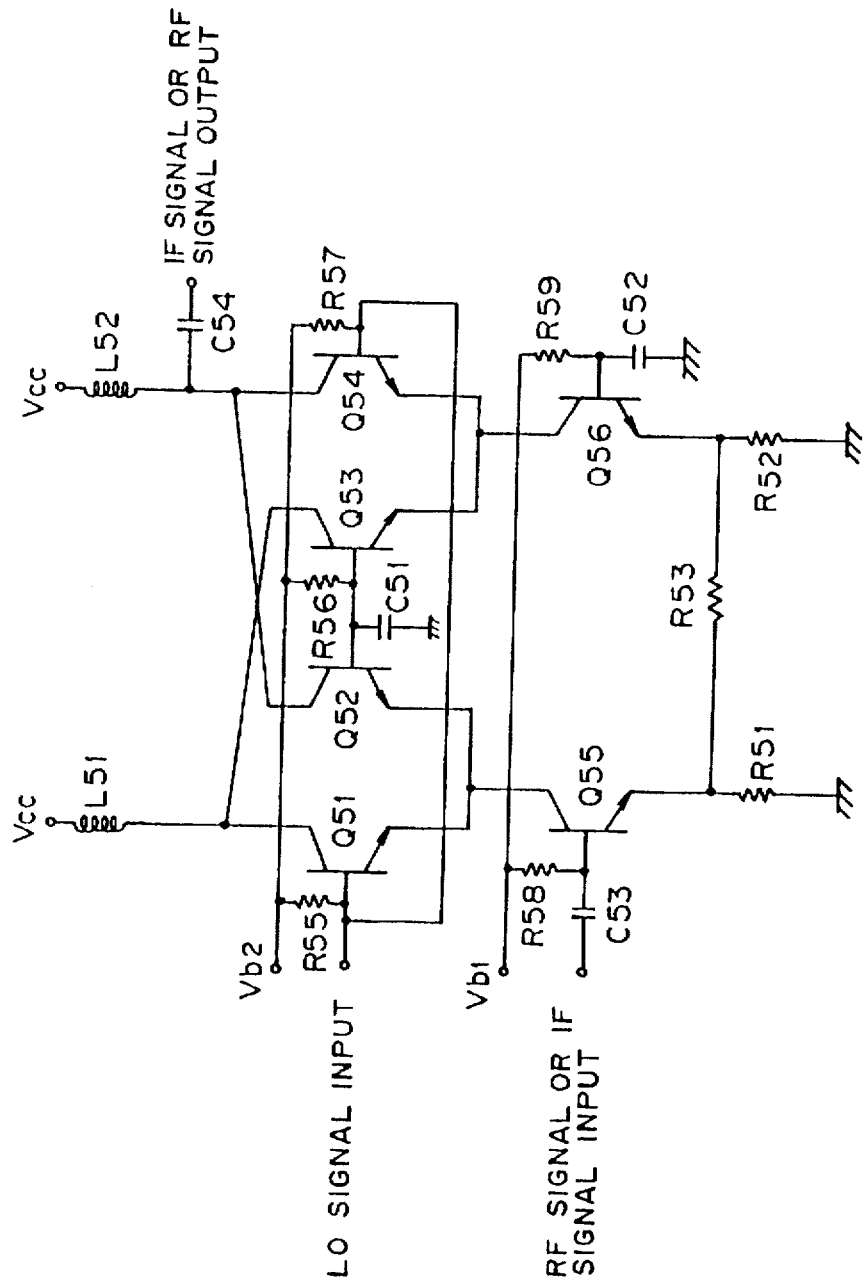
FIG. 5 is an electrical circuit diagram showing a general double-balanced mixer circuit.
Figure 6:
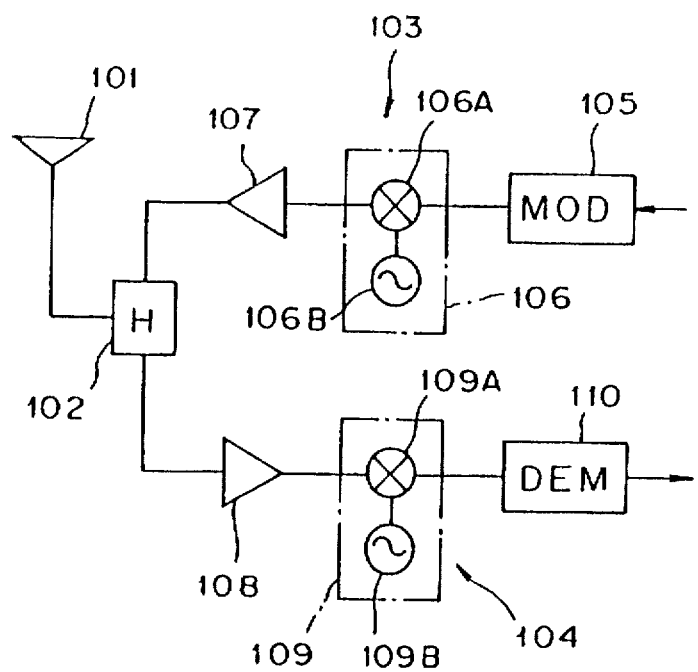
FIG. 6 is a block diagram showing the transmitter and receiver section for a portable telephone set.

In the circuit configuration shown in FIG. 4, the RF signal or the IF signal is input to the gate of the D-mode FET Q41 via the matching circuit 44 and the inverted signal of the RF or IF signal is input to the gate of the D-mode FET Q42 via the phase shifter 47 and the matching circuit 44'. Moreover, the LO signal is input to the gate of the D-mode FET Q44 via the matching circuit 45 and the inverted signal of the LO signal is input to the gate of the D-mode FET Q43 via the phase shifter 48 and the matching circuit 45'. As a result, the IF or RF signal frequency-converted is output at the output terminal according to the same theory and function as those of the circuit in the first embodiment.

In this case, when the RF signal and the LO signal are input and the IF signal is output, the mixer circuit functions as a down-converter. When the IF signal and the LO signal are input and the RF signal is output, the mixer circuit functions as an up-converter.

As described above, according to the present embodiment, the double-balanced mixer circuit which facilitates the inputting operation and can be sufficiently operated with the reduced power source voltage (3 volts) can be provided.

In the first embodiment, the leak cancelling signal is created without inputting signals reversed in phase with each other to the confront transistors. However, in the fourth embodiment, a signal with the phase perfectly reversed can be used because the leak cancelling signal is created by inputting signals which are in opposite phase with each other to the confront transistors. As a result, the leak canceling amount can be increased.

The fourth embodiment uses D-mode FETs as the transistors, but can also use bipolar transistors. In this case, the source of the FET corresponds to the emitter of the bipolar transistor. The drain of the FET corresponds to the collector of the bipolar transistor. The gate of the FET corresponds to the base of the bipolar transistor.

(e) Others

Each of the above-mentioned embodiments discloses the configuration in which the output signal having frequency information regarding the sum of the first input signal and the second input signal or difference between them is output from the junction where the drains or collectors of the first transistors Q11 to Q41 are connected to the drains or collectors of the third transistors Q13 to Q43. However, it is possible to output the output signal having frequency information regarding the sum of the first input signal and the second input signal or difference between them from the junction where the drains or collectors of the second transistors Q12 to Q42 are connected to the drains or collectors of the fourth transistors Q14 to Q44.

What is claimed is:

1. A double-balanced mixer circuit comprising:
  a first differential circuit formed of a first transistor and a second transistor connected differentially to each other;
  a second differential circuit formed of a third transistor and a fourth transistor connected differentially to each other;
  said first transistor having a source or emitter connected to a source or emitter of said second transistor;
  said third transistor having a source or emitter connected to a source or emitter of said fourth transistor;
  said first transistor having a drain or collector connected to a drain or collector of said third transistor;
  said second transistor having a drain or collector connected to a drain or collector of said fourth transistor; and
  a leak cancelling capacitor connecting a junction of the drain or collector of said first transistor and the drain or collector of said third transistor with a junction of said drain or collector of said second transistor and the drain or collector of said fourth transistor;
  either the junction of the drain or collector of said first transistor and the drain or collector of said third transistor or the junction of the drain or collector of said second transistor and the drain or collector of said fourth transistor producing an output signal having frequency information on a sum of a first input signal and a second input signal or a difference between them when said first input signal is input to said first differential circuit and said second input signal is input to said second differential circuit;

each of said first transistor, second transistor, third transistor, and fourth transistor has a gate or base grounded via a resistor or inductance.

2. The double-balanced mixer circuit according to claim 1, wherein said junction of the source or emitter of said first transistor and the source or emitter of said second transistor is grounded via a first resistor, and wherein said junction of the source or emitter of said third transistor and the source or emitter of said fourth transistor is grounded via a second resistor.

3. The double-balanced mixer circuit according to claim 1, wherein said junction of the drain or collector of said first transistor and the drain or collector of said third transistor is connected to a power source via an inductance or resistor, and wherein said junction of the drain or collector of said second transistor and the drain or collector of said fourth transistor is connected to said power source via an another inductance or resistor.

4. The double-balanced mixer circuit according to claim 3, wherein said power source which supplies a voltage to said junction of the drain or collector of said first transistor and the drain or collector of said third transistor is shared with said power source which supplies a voltage to said junction of the drain or collector of said second transistor and the drain or collector of said fourth transistor.

5. The double-balanced mixer circuit according to claim 1, wherein said leak cancelling capacitor comprises a capacitor exhibiting a low impedance at the frequency of any one of said first input signal, said second input signal, and said output signal.

6. A double-balanced mixer circuit comprising:

a first differential circuit formed of a first transistor and a second transistor connected differentially to each other;

a second differential circuit formed of a third transistor and a fourth transistor connected differentially to each other;

said first transistor having a source or emitter connected to a source or emitter of said second transistor;

said third transistor having a source or emitter connected to a source or emitter of said fourth transistor;

said first transistor having a drain or collector connected to a drain or collector of said third transistor;

said second transistor having a drain or collector connected to a drain or collector of said fourth transistor; and a leak cancelling capacitor connecting a junction of the drain or collector of said first transistor and the drain or collector of said third transistor with a junction of said drain or collector of said second transistor and the drain or collector of said fourth transistor;

either the junction of the drain or collector of said first transistor and the drain or collector of said third transistor or the junction of the drain or collector of said second transistor and the drain or collector of said fourth transistor producing an output signal having frequency information on a sum of a first input signal and a second input signal or a difference between them when said first input signal is input to said first differential circuit and said second input signal is input to said second differential circuit;

each of said first transistor, second transistor, third transistor, and fourth transistor has a gate or base connected to a power source via a resistor or inductance.

7. The double-balanced mixer circuit according to claim 6, wherein said junction of the source or emitter of said first transistor and the source or emitter of said second transistor is grounded via a first resistor, and wherein said junction of the source or emitter of said third transistor and the source or emitter of said fourth transistor is grounded via a second resistor.

8. The double-balanced mixer circuit according to claim 6, wherein said junction of the drain or collector of said first transistor and the drain or collector of said third transistor is connected to said power source via an inductance or resistor, and wherein said junction of the drain or collector of said second transistor and the drain or collector of said fourth transistor is connected to said power source via another inductance or resistor.

9. The double-balanced mixer circuit according to claim 8, wherein said power source which supplies a voltage to said junction of the drain or collector of said first transistor and the drain or collector of said third transistor is shared with said power source which supplies a voltage to said junction of the drain or collector of said second transistor and the drain or collector of said fourth transistor.

10. A double-balanced mixer circuit according to claim 6, wherein said leak cancelling capacitor comprises a capacitor exhibiting a low impedance at the frequency of any one of said first input signal, said second input signal, and said output signal.

11. A double-balanced mixer circuit comprising:

a first differential circuit formed of a first transistor and a second transistor connected differentially to each other;

a second differential circuit formed of a third transistor and a fourth transistor connected differentially to each other;

said first transistor having a source or emitter connected to a source or emitter of said second transistor;

said third transistor having a source or emitter connected to a source or emitter of said fourth transistor;

said first transistor having a drain or collector connected to a drain or collector of said third transistor;

said second transistor having a drain or collector connected to a drain or collector of said fourth transistor; and a leak cancelling capacitor connecting a junction of the drain or collector of said first transistor and the drain or collector of said third transistor with a junction of said drain or collector of said second transistor and the drain or collector of said fourth transistor;

either the junction of the drain or collector of said first transistor and the drain or collector of said third transistor or the junction of the drain or collector of said second transistor and the drain or collector of said fourth transistor producing an output signal having frequency information on a sum of a first input signal and a second input signal or a difference between them when said first input signal is input to said first differential circuit and said second input signal is input to said second differential circuit;

wherein the gate or base of one of said first and second transistors is grounded via a first capacitor exhibiting a low impedance at a frequency of said first input signal when said first input signal is input to the gate or base of the other one of said first and second transistors in said first differential circuit; and wherein the gate or base of one of said third and fourth transistors is grounded via a second capacitor exhibiting a low impedance at the frequency of said second input signal when said second input signal is input to the gate or base of the other one of said third and fourth transistors in said second differential circuit.

12. The double-balanced mixer circuit according to claim 11, wherein said junction of the source or emitter of said first transistor and the source or emitter of said second transistor is grounded via a first resistor, and wherein said junction of the source or emitter of said third transistor and the source or emitter of said fourth transmitter is grounded via a second resistor.

13. The double-balanced mixer circuit according to claim 11, wherein said junction of the drain or collector of said first transistor and the drain or collector of said third transistor is connected to said power source via an inductance or resistor, and wherein said junction of the drain or collector of said second transistor and the drain or collector of said fourth transistor is connected to said power source via an another inductance or resistor.

14. The double-balanced mixer circuit according to claim 13, wherein said power source which supplies a voltage to said junction of the drain or collector of said first transistor and the drain or collector of said third transistor is shared with said power source which supplies a voltage to said junction of the drain or collector of said second transistor and the drain or collector of said fourth transistor.

15. The double-balanced mixer circuit according to claim 11, wherein said leak cancelling capacitor comprises a capacitor exhibiting a low impedance at the frequency of any one of said first input signal, said second input signal, and said output signal.

16. The double-balanced mixer circuit comprising:

a first differential circuit formed of a first transistor and a second transistor connected differentially to each other;

a second differential circuit formed of a third transistor and a fourth transistor connected differentially to each other;

said first transistor having a source or emitter connected to a source or emitter of said second transistor;

said third transistor having a source or emitter connected to a source or emitter of said fourth transistor;

said first transistor having a drain or collector connected to a drain or collector of said third transistor;

said second transistor having a drain or collector connected to a drain or collector of said fourth transistor; and a leak cancelling capacitor connecting a junction of the drain or collector of said first transistor and the drain or collector of said third transistor with a junction of said drain or collector of said second transistor and the drain or collector of said fourth transistor;

either the junction of the drain or collector of said first transistor and the drain or collector of said third transistor or the junction of the drain or collector of said second transistor and the drain or collector of said fourth transistor producing an output signal having frequency information on a sum of a first input signal and a second input signal or a difference between them when said first input signal is input to said first differential circuit and said second input signal is input to said second differential circuit;

wherein a first inverted input signal obtained by inverting said first input signal is input to the gate or base of one of said first and second transistors when said first input signal is input to the gate or base of the other one of said first and second transistors in said first differential circuit; and wherein a second inverted input signal obtained by inverting said second input signal is input to the gate or base of one of said third and fourth transistors when said second input signal is input to the gate or base of the other one of said third and fourth transistors in said second differential circuit.

17. The double-balanced mixer circuit according to claim 16, wherein said junction of the source or emitter of said first transistor and the source or emitter of said second transistor is grounded via a first resistor, and wherein said junction of the source or emitter of said third transistor and the source or emitter of said fourth transistor is grounded via a second resistor.

18. The double-balanced mixer circuit according to claim 16, wherein said junction of the drain or collector of said first transistor and the drain or collector of said third transistor is connected to said power source via an inductance or resistor, and wherein said junction of the drain or collector of said second transistor and the drain or collector of said fourth transistor is connected to said power source via an another inductance or resistor.

19. The double-balanced mixer circuit according to claim 18, wherein said power source which supplies a voltage to said junction of the drain or collector of said first transistor and the drain or collector of said third transistor is shared with said power source which supplies a voltage to said junction of the drain or collector of said second transistor and the drain or collector of said fourth transistor.

20. The double-balanced mixer circuit according to claim 16, wherein said leak cancelling capacitor comprises a capacitor exhibiting a low impedance at the frequency of any one of said first input signal, said second input signal, and said output signal.

21. The double-balanced mixer circuit according to claim 16, wherein the gate or base of one of said first and second transistors and the gate or base of the other one of said first and second transistors are connected via a first phase inverting circuit; and wherein the gate or base of one of said third and fourth transistors and the gate or base of the other one of said third and fourth transistors are connected via a second phase inverting circuit.

\* \* \* \* \*